United States Patent
Jung

(10) Patent No.: US 10,715,308 B2
(45) Date of Patent: Jul. 14, 2020

(54) TRANSMITTING CIRCUIT, SEMICONDUCTOR APPARATUS AND SEMICONDUCTOR SYSTEM CONFIGURED TO USE THE TRANSMITTING CIRCUIT

(71) Applicant: SK hynix Inc., Icheon-si Gyeonggi-do (KR)

(72) Inventor: Hae Kang Jung, Gwangmyeong-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 16/200,322

(22) Filed: Nov. 26, 2018

(65) Prior Publication Data

US 2019/0319779 A1  Oct. 17, 2019

(30) Foreign Application Priority Data

Apr. 17, 2018  (KR) .................. 10-2018-0044301

(51) Int. Cl.
*H04L 7/06* (2006.01)
*H04L 7/00* (2006.01)

(52) U.S. Cl.
CPC .............. *H04L 7/06* (2013.01); *H04L 7/0008* (2013.01); *H04L 7/0054* (2013.01); *H04L 7/0091* (2013.01)

(58) Field of Classification Search
CPC ........................................................ H04L 7/06
USPC ........................................................ 375/362
See application file for complete search history.

(56) References Cited

U.S. PATENT DOCUMENTS

| | | | |
|---|---|---|---|
| 7,034,597 B1 | 4/2006 | Mo et al. | |
| 2002/0172304 A1* | 11/2002 | Saze | ..................... G11C 7/1078 375/340 |
| 2018/0090186 A1* | 3/2018 | Kang | ................... G11C 29/022 |

* cited by examiner

*Primary Examiner* — Lihong Yu
(74) *Attorney, Agent, or Firm* — William Park & Associates Ltd.

(57) ABSTRACT

A transmitting circuit may include a clock generation circuit and a serializer. The clock generation circuit may generate a plurality of output clock signals by performing an emphasis operation for a plurality of clock signals based on a plurality of data. The serializer may output the plurality of data as output data in synchronization with the plurality of output clock signals.

20 Claims, 5 Drawing Sheets

TRANSMITTING CIRCUIT, SEMICONDUCTOR APPARATUS AND SEMICONDUCTOR SYSTEM CONFIGURED TO USE THE TRANSMITTING CIRCUIT

CROSS-REFERENCES TO RELATED APPLICATION

The present application claims priority under 35 U.S.C. § 119(a) to Korean application number 10-2018-0044301, filed on Apr. 17, 2018, in the Korean Intellectual Property Office, which is incorporated herein by reference in its entirety.

BACKGROUND

1. Technical Field

Various embodiments generally relate to an integrated circuit technology and, more particularly, to a semiconductor apparatus and a semiconductor system.

2. Related Art

Electronic apparatuses may consist of a large number of electronic components. Among the electronic apparatuses, a computer system may consist of many electronic components which are constructed by semiconductors. Semiconductor apparatuses which construct a computer system may transmit data in synchronization with a clock, and perform serial communication. In order to quickly process a large amount of data in the semiconductor apparatuses, each of the semiconductor apparatuses receives data inputted in series from another semiconductor apparatus, and converts the received data into a parallel type. Also, each of the semiconductor apparatuses may convert internal data of a parallel type into a serial type, and output the converted data to another semiconductor apparatus. That is to say, each of the semiconductor apparatuses may include a serializer which converts data of a parallel type into data of a serial type, to perform serial communication through a data bus.

It is the norm that the serializer has a configuration to sequentially output a plurality of data in synchronization with a clock. Currently, computer systems and semiconductor apparatuses tend to be developed toward a high speed operation and low power consumption. As the operating speed of a system is increased, the speed of a clock is gradually increased, and, as a system consumes low power, the amplitudes of the clock and data are decreased. Therefore, a serializer capable of precisely converting data in step with the recent technical trend is demanded in the art.

SUMMARY

In an embodiment, a transmitting circuit includes a clock generation circuit, and a serializer. The clock generation circuit may be configured to generate a plurality of output clock signals by performing an emphasis operation for at least one among a plurality of clock signals based on at least one among a plurality of data. The serializer may be configured to output the plurality of data as output data in synchronization with the plurality of output clock signals.

In an embodiment, a transmitting circuit includes a serializer, and a clock generation circuit. The serializer may be configured to output n^th data in synchronization with a first output clock signal, output (n+1)^th data in synchronization with a second output clock signal, output (n+2)^th data in synchronization with a third output clock signal, and output (n+3)^th data in synchronization with a fourth output clock signal. The clock generation circuit may be configured to generate the first output clock signal, the second output clock signal, the third output clock signal and the fourth output clock signal from a first clock signal, a second clock signal, a third clock signal and a fourth clock signal based on the n^th data, the (n+1)^th data, the (n+2)^th data and the (n+3)^th data.

DETAILED DESCRIPTION

Hereinafter, a transmitting circuit which may be for improving a data eye, a semiconductor apparatus and a semiconductor system using the transmitting circuit will be described below with reference to the accompanying drawings through various examples of embodiments.

Figure 1:
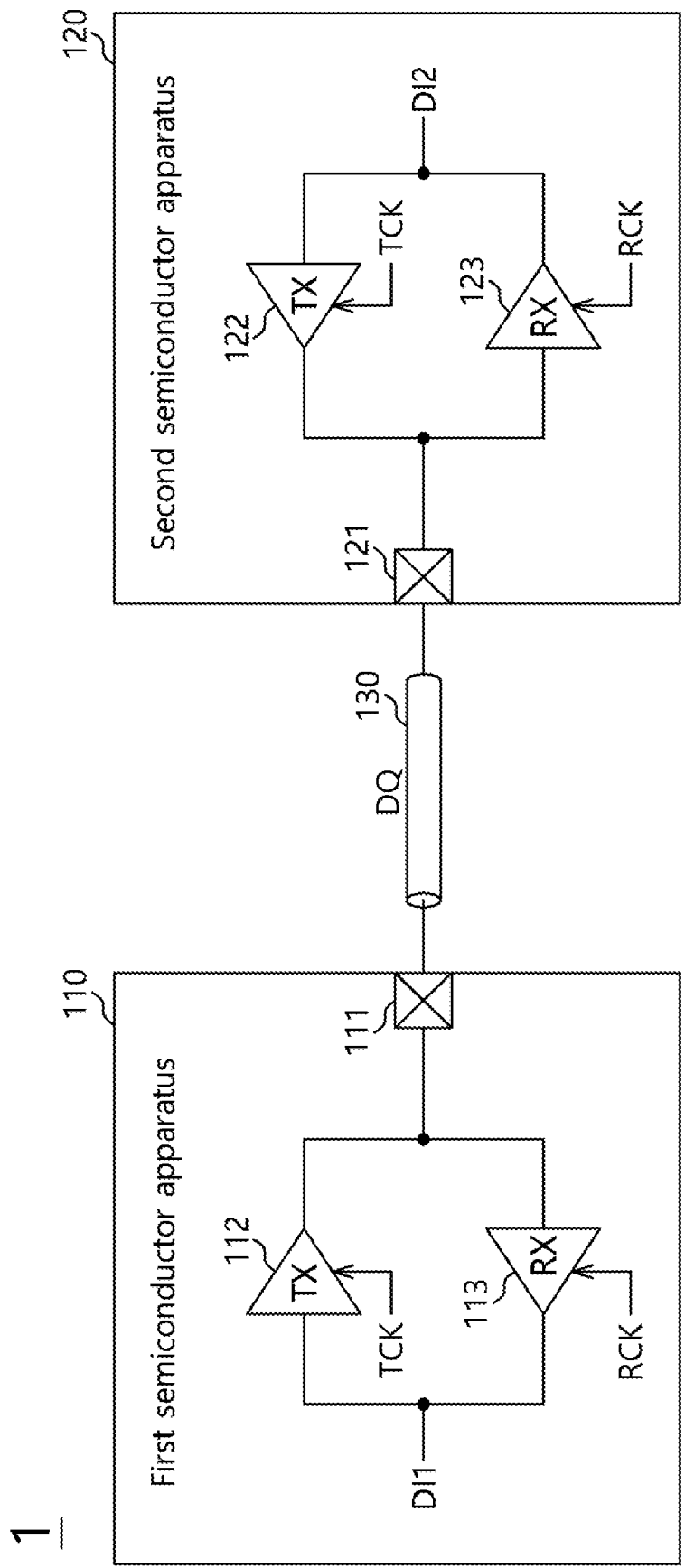
FIG. 1 is a diagram illustrating a configuration of a semiconductor system in accordance with an embodiment.

FIG. 1 is a diagram illustrating a representation of an example of the configuration of a semiconductor system 1 in accordance with an embodiment. In FIG. 1, the semiconductor system 1 may include a first semiconductor apparatus 110 and a second semiconductor apparatus 120. The first semiconductor apparatus 110 may provide various control signals which are necessary for the second semiconductor apparatus 120 to operate. The first semiconductor apparatus 110 may include various kinds of apparatuses. For example, the first semiconductor apparatus 110 may be a host apparatus such as a central processing unit (CPU), a graphic processing unit (GPU), a multimedia processor (MMP), a digital signal processor, an application processor (AP) and a memory controller, etc. Also, the first semiconductor apparatus 110 may be a test apparatus or test equipment for testing the second semiconductor apparatus 120.

The second semiconductor apparatus 120 may be, for example, a memory apparatus, and the memory apparatus may include a volatile memory or a nonvolatile memory. The volatile memory may include an SRAM (static RAM), a DRAM (dynamic RAM) or an SDRAM (synchronous DRAM), and the nonvolatile memory may include a ROM (read only memory), a PROM (programmable ROM), an EEPROM (electrically erasable and programmable ROM), an EPROM (electrically programmable ROM), a flash memory, a PRAM (phase change RAM), an MRAM (magnetic RAM), an RRAM (resistive RAM) or an FRAM (ferroelectric RAM), etc.

The first and second semiconductor apparatuses 110 and 120 may be coupled with each other through a signal transmission line 130. The first semiconductor apparatus 110 may include a pad 111, and the pad 111 may be coupled with the signal transmission line 130. The second semiconductor apparatus 120 may include a pad 121, and the pad 121 may be coupled with the signal transmission line 130. The signal transmission line 130 may be a channel, a link or a bus. In an embodiment, the signal transmission line 130 may be a data transmission line, and a signal to be transmitted through the signal transmission line 130 may be data DQ.

The first semiconductor apparatus 110 may include a transmitting circuit (TX) 112 and a receiving circuit (RX) 113. The transmitting circuit 112 may transmit data DQ to the second semiconductor apparatus 120 through the signal transmission line 130, based on internal data DI1 of the first semiconductor apparatus 110. The receiving circuit 113 may receive data DQ transmitted from the second semiconductor apparatus 120, through the signal transmission line 130, and generate internal data DI1. Similarly, the second semiconductor apparatus 120 may include a transmitting circuit (TX) 122 and a receiving circuit (RX) 123. The transmitting circuit 122 may transmit data DQ to the first semiconductor apparatus 110 through the signal transmission line 130, based on internal data DI2 of the second semiconductor apparatus 120. The receiving circuit 123 may receive data DQ transmitted from the first semiconductor apparatus 110, through the signal transmission line 130, and generate internal data DI2.

The transmitting circuits 112 and 122 may transmit data DQ to the signal transmission line 130 in synchronization with clock signals, and the receiving circuits 113 and 123 may receive data DQ transmitted through the signal transmission line 130, in synchronization with clock signals. The transmitting circuits 112 and 122 may be a transmission clock signal TCK. The transmitting circuit 112 may output internal data DI1 as data DQ in synchronization with the transmission clock signal TCK. The transmitting circuit 122 may output internal data DI2 as data DQ in synchronization with the transmission clock signal TCK. The receiving circuits 113 and 123 may receive a reception clock signal RCK. The receiving circuit 113 may receive and/or sample data DQ transmitted through the signal transmission line 130, in synchronization with the reception clock signal RCK, and generate internal data DI1. The receiving circuit 123 may receive and/or sample data DQ transmitted through the signal transmission line 130, in synchronization with the reception clock signal RCK, and generate internal data DI2.

Data DQ to be transmitted through the signal transmission line 130, as serial type data, may be a data stream in which a plurality of data are successively transmitted. The internal data DI1 and DI2 of the first and second semiconductor apparatuses 110 and 120 may be parallel type data. Each of the transmitting circuits 112 and 122 may include a serializer to convert the parallel type internal data DI1 and DI2 into serial type data. Each of the receiving circuits 113 and 123 may include a deserializer to convert serial type data into the parallel type internal data DI1 and DI2. The transmission clock signal TCK and the reception clock signal RCK may include a plurality of clock signals which have different phases. The transmitting circuits 112 and 122 may convert the parallel type internal data DI1 and DI2 into data DQ in synchronization with a plurality of clock signals which have different phases. The receiving circuits 113 and 123 may convert data DQ into the parallel type internal data DI1 and DI2 in synchronization with a plurality of clock signals which have different phases. While not shown, each of the first and second semiconductor apparatuses 110 and 120 may include a clock generation circuit for generating the transmission clock signal TCK and the reception clock signal RCK.

Figure 2:
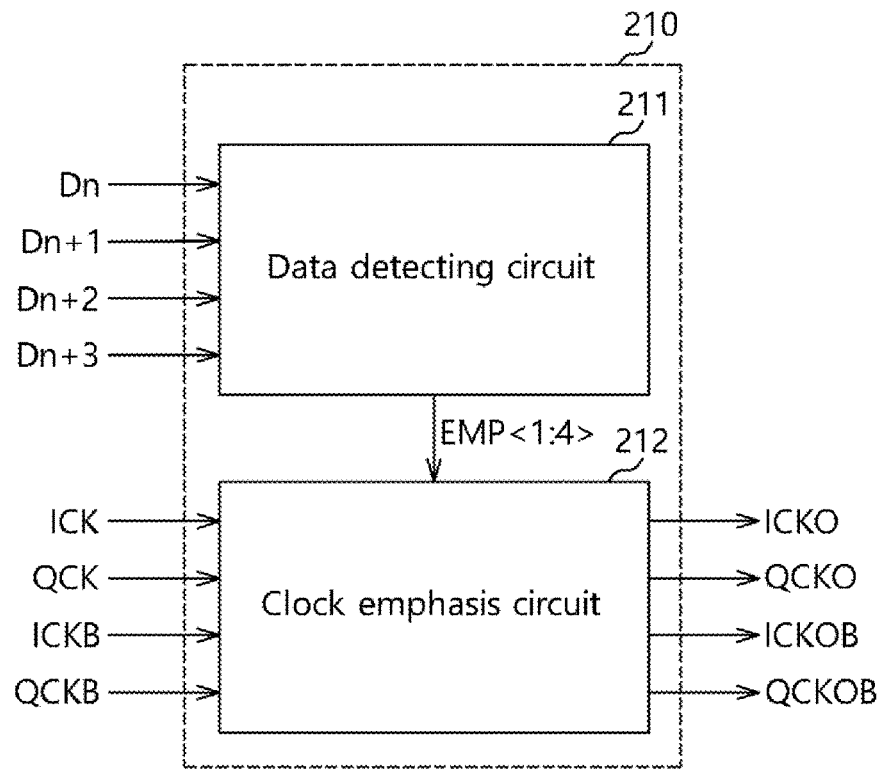
FIG. 2 is a diagram illustrating a configuration of a transmitting circuit in accordance with an embodiment.
Figure 2:
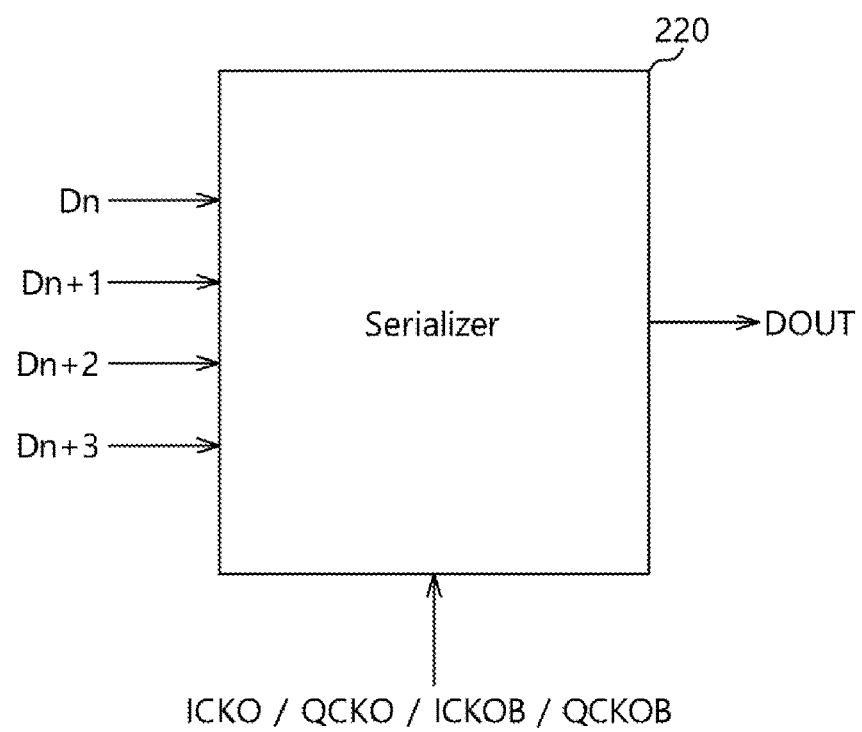

FIG. 2 is a diagram illustrating a representation of an example of the configuration of a transmitting circuit 200 in accordance with an embodiment. The transmitting circuit 200 may be applied as each of the transmitting circuits 112 and 122 shown in FIG. 1. In FIG. 2, the transmitting circuit 200 may receive a plurality of data and a plurality of clock signals and generate output data DOUT. The plurality of data (i.e., Dn to Dn+3) may correspond to the internal data DI1 and DI2 shown in FIG. 1, the plurality of clock signals (i.e., ICK, QCK, ICKB, and QCKB) may correspond to the transmission clock signal TCK shown in FIG. 1, and the output data DOUT may correspond to the data DQ transmitted through the signal transmission line 130 shown in FIG. 1. The transmitting circuit 200 may generate a plurality of output clock signals by performing an emphasis operation for at least one among the plurality of clock signals based on at least one among the plurality of data. The transmitting circuit 200 may output the plurality of data as the output data DOUT, respectively, in synchronization with the plurality of output clock signals. The transmitting circuit 200 may perform the emphasis operation to improve and/or extend the eye and/or valid window of the output data DOUT. The emphasis operation may be to extend the pulse widths of the plurality of clock signals and thereby generate the plurality of output clock signals. The emphasis operation may be to advance the phases of the rising edges of the plurality of clock signals and thereby generate the plurality of output clock signals. The transmitting circuit 200 may selectively perform the emphasis operation by monitoring and/or sensing the level of previous data already outputted and the level of current data to be outputted. The emphasis operation may be performed for at least one clock signal among the plurality of clock signals.

In FIG. 2, the transmitting circuit 200 may include a clock generation circuit 210 and a serializer 220. The clock generation circuit 210 may receive a plurality of data and a plurality of clock signals and generate a plurality of output clock signals. The plurality of data may include nˆth data Dn, (n+1)ˆth data Dn+1, (n+2)ˆth data Dn+2 and (n+3)ˆth data Dn+3. 'n' may be an integer of 1 or more. The plurality of clock signals may include a first clock signal ICK, a second clock signal QCK, a third clock signal ICKB and a fourth clock signal QCKB. The plurality of output clock signals may include a first output clock signal ICKO, a second output clock signal QCKO, a third output clock signal ICKOB and a fourth output clock signal QCKOB. In FIG. 2, it is illustrated as an example that the serializer 220 is a 4:1 serializer and therefore each of the numbers of data and clock signals received by the transmitting circuit 200 is 4. However, it is to be noted that the embodiments are not limited thereto and each of the numbers of data and clock signals may be changed variously depending on the configuration of the serializer 220. The first to fourth clock signals ICK, QCK, ICKB and QCKB may be clock signals which sequentially have a predetermined phase difference. For example, the predetermined phase difference may be 90 degrees. The first clock signal ICK may have a phase 90 degrees earlier than the second clock signal QCK, and the second clock signal QCK may have a phase 90 degrees earlier than the third clock signal ICKB. The third clock signal ICKB may have a phase 90 degrees earlier than the fourth clock signal QCKB. The fourth clock signal QCKB may have a phase 90 degrees earlier than the first clock signal ICK.

The word "predetermined" as used herein with respect to a parameter, such as a predetermined phase difference, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

The clock generation circuit 210 may generate the first to fourth output clock signals ICKO, QCKO, ICKOB and QCKOB by performing an emphasis operation for at least one among the first to fourth clock signals ICK, QCK, ICKB and QCKB based on at least one among the n^th to (n+3)^th data Dn, Dn+1, Dn+2 and Dn+3. The serializer 220 may receive the n^th to (n+3)^th data Dn, Dn+1, Dn+2 and Dn+3, and the first to fourth output clock signals ICKO, QCKO, ICKOB and QCKOB generated from the clock generation circuit 210. The serializer 220 may output the n^th data Dn as the output data DOUT in synchronization with the first output clock signal ICKO. The serializer 220 may output the (n+1)^th data Dn+1 as the output data DOUT in synchronization with the second output clock signal QCKO. The serializer 220 may output the (n+2)^th data Dn+2 as the output data DOUT in synchronization with the third output clock signal ICKOB. The serializer 220 may output the (n+3)^th data Dn+3 as the output data DOUT in synchronization with the fourth output clock signal QCKOB. For example, in the case where the output data DOUT includes a total of eight data, the serializer 220 may output first and fifth data in synchronization with the first output clock signal ICKO, output second and sixth data in synchronization with the second output clock signal QCKO, output third and seventh data in synchronization with the third output clock signal ICKOB, and output fourth and eighth data in synchronization with the fourth output clock signal QCKOB.

The clock generation circuit 210 may include a data detecting circuit 211 and a clock emphasis circuit 212. The data detecting circuit 211 may receive the n^th to (n+3)^th data Dn, Dn+1, Dn+2 and Dn+3 and generate emphasis control signals EMP<1:4>. The data detecting circuit 211 may generate the emphasis control signals EMP<1:4> by sensing the level of previously outputted data and the level of data to be currently outputted. The emphasis control signals EMP<1:4> may include a plurality of bits. Each of the emphasis control signals EMP<1:4> may determine whether to perform an emphasis operation for a clock signal allocated thereto. For example, the emphasis control signal EMP<1> may determine whether to perform an emphasis operation for the first clock signal ICK associated with the n^th data Dn, and the emphasis control signal EMP<2> may determine whether to perform an emphasis operation for the second clock signal QCK associated with the (n+1)^th data Dn+1. The emphasis control signal EMP<3> may determine whether to perform an emphasis operation for the third clock signal ICKB associated with the (n+2)^th data Dn+2, and the emphasis control signal EMP<4> may determine whether to perform an emphasis operation for the fourth clock signal QCKB associated with the (n+3)^th data Dn+3. In an embodiment, the data detecting circuit 211 may be implemented with software, hardware, or any combination thereof.

The data detecting circuit 211 may determine a situation where inter-symbol interference (ISI) severely occurs, based on the n^th to (n+3)^th data Dn, Dn+1, Dn+2 and Dn+3. The situation where inter-symbol interference severely occurs may result when a signal abruptly transitions to a high level while being held at a low level and/or a high resistance state. Also, inter-symbol interference may severely occur when a signal transitions to the other level while being held at one level of high and low levels for a predetermined time. The inter-symbol interference may retard the transition time of data and thereby decrease the eye and/or valid window of the data. In order to prevent the eye of data from being decreased by the inter-symbol interference, the data detecting circuit 211 may generate the emphasis control signals EMP<1:4> when the transmitting circuit 200 outputs first data having a high level as the output data DOUT, such that an emphasis operation may be performed for a clock signal with which the first data is synchronized. For example, when first data (that is, the n^th data Dn) has a high level and the output data DOUT is generated from the first data, the data detecting circuit 211 may enable the emphasis control signal EMP<1> such that an emphasis operation for the first clock signal ICK may be performed and thereby the first output clock signal ICKO may be generated.

The data detecting circuit 211 may enable the emphasis control signals EMP<1:4> when the transmitting circuit 200 outputs data of the other level while successively outputting data having one level of high and low levels by a threshold number of times, such that an emphasis operation may be performed for a clock signal with which the data of the other level is synchronized. The threshold number of times may be, for example, 3. For example, when the transmitting circuit 200 successively outputs the (n+2)^th data Dn+2, the (n+3)^th data Dn+3 and the n^th data Dn each of which has a low level, as the output data DOUT, and the (n+1)^th data Dn+1 to be outputted next has a high level, the data detecting circuit 211 may enable the emphasis control signal EMP<2> such that an emphasis operation for the second clock signal QCK may be performed.

The clock emphasis circuit 212 may receive the first to fourth clock signals ICK, QCK, ICKB and QCKB and the emphasis control signals EMP<1:4> and generate the first to fourth output clock signals ICKO, QCKO, ICKOB and QCKOB. The clock emphasis circuit 212 may generate the first to fourth output clock signals ICKO, QCKO, ICKOB and QCKOB by performing an emphasis operation for the first to fourth clock signals ICK, QCK, ICKB and QCKB based on the emphasis control signals EMP<1:4>. The emphasis operation may be an operation of extending the pulse widths of the first to fourth output clock signals ICKO, QCKO, ICKOB and QCKOB in comparison with the first to fourth clock signals ICK, QCK, ICKB and QCKB or advancing the phases of the rising edges of the first to fourth output clock signals ICKO, QCKO, ICKOB and QCKOB in comparison with the rising edges of the first to fourth clock signals ICK, QCK, ICKB and QCKB. The clock emphasis circuit 212 may use a clock signal which has a phase earlier than a clock signal being a target of an emphasis operation, to perform the emphasis operation. For example, an emphasis operation for the first clock signal ICK may be performed by using the fourth clock signal QCKB, and an emphasis operation for the second clock signal QCK may be performed by using the first clock signal ICK. An emphasis operation for the third clock signal ICKB may be performed by using the second clock signal QCK, and an emphasis operation for the fourth clock signal QCKB may be performed by using the third clock signal ICKB. The clock emphasis circuit 212 may selectively perform an emphasis operation for a clock signal requiring an emphasis operation among the first to fourth clock signals ICK, QCK, ICKB and QCKB, based on the emphasis control signals EMP<1:4>. A clock signal for which an emphasis operation is performed may be outputted as an output clock signal by being increased in its pulse width or being advanced in its phase, and a clock signal for which an emphasis operation is not performed may be outputted as an output clock signal as it is.

Figure 3:
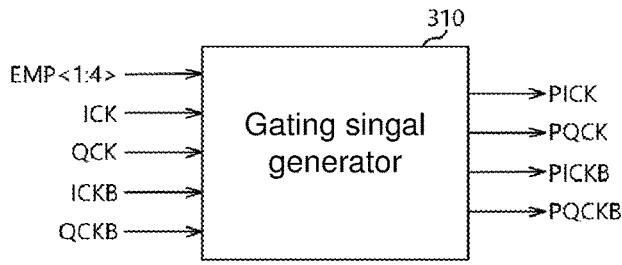
FIG. 3 is a diagram illustrating a configuration of the clock emphasis circuit shown in FIG. 2.
Figure 3:
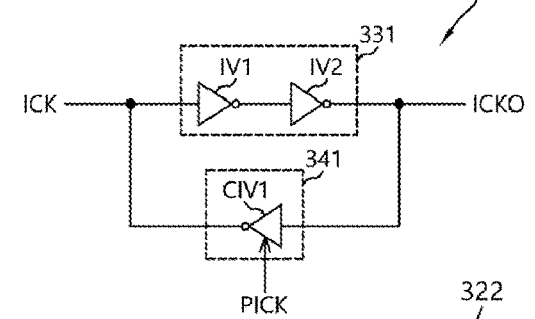
Figure 3:
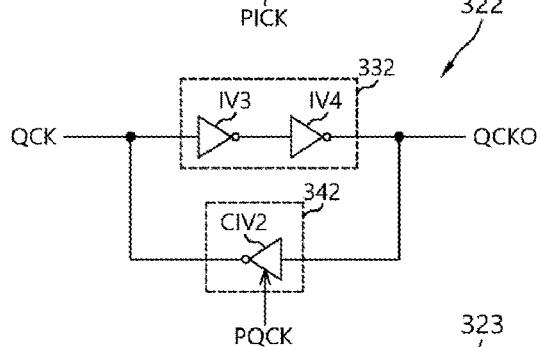
Figure 3:
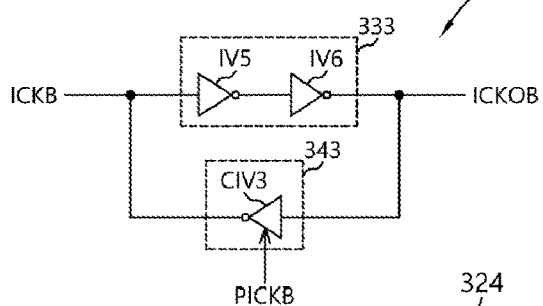
Figure 3:
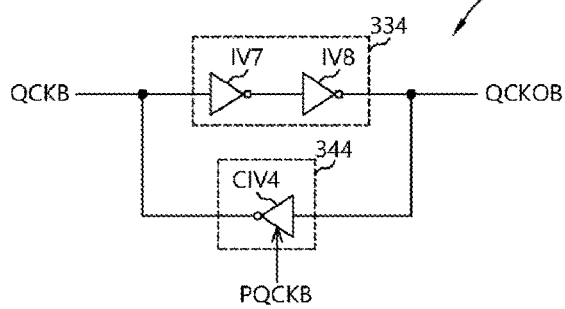

FIG. 3 is a diagram illustrating a representation of an example of the configuration of the clock emphasis circuit 212 shown in FIG. 2. In FIG. 3, the clock emphasis circuit 212 may include a gating signal generator 310 and a clock driver 320. The gating signal generator 310 may receive the emphasis control signals EMP<1:4> and the first to fourth clock signals ICK, QCK, ICKB and QCKB. The gating signal generator 310 may generate first to fourth gating clock signals PICK, PQCK, PICKB and PQCKB based on the emphasis control signals EMP<1:4> and the first to fourth clock signals ICK, QCK, ICKB and QCKB. When the emphasis control signal EMP<1> is enabled, the gating signal generator 310 may output the fourth clock signal QCKB which has a phase earlier than the first clock signal ICK, as the first gating clock signal PICK. When the emphasis control signal EMP<2> is enabled, the gating signal generator 310 may output the first clock signal ICK which has a phase earlier than the second clock signal QCK, as the second gating clock signal PQCK. When the emphasis control signal EMP<3> is enabled, the gating signal generator 310 may output the second clock signal QCK which has a phase earlier than the third clock signal ICKB, as the third gating clock signal PICKB. When the emphasis control signal EMP<4> is enabled, the gating signal generator 310 may output the third clock signal ICKB which has a phase earlier than the fourth clock signal QCKB, as the fourth gating clock signal PQCKB. In an embodiment, the gating signal generator 310 may be implemented with software, hardware, or any combination thereof.

The clock driver 320 may receive the first to fourth clock signals ICK, QCK, ICKB and QCKB and the first to fourth gating clock signals PICK, PQCK, PICKB and PQCKB and generate the first to fourth output clock signals ICKO, QCKO, ICKOB and QCKOB. The clock driver 320 may include a first driver 321, a second driver 322, a third driver 323 and a fourth driver 324. The first driver 321 may receive the first clock signal ICK and the first gating clock signal PICK, and generate the first output clock signal ICKO by performing an emphasis operation for the first clock signal ICK based on the first gating clock signal PICK. The second driver 322 may receive the second clock signal QCK and the second gating clock signal PQCK, and generate the second output clock signal QCKO by performing an emphasis operation for the second clock signal QCK based on the second gating clock signal PQCK. The third driver 323 may receive the third clock signal ICKB and the third gating clock signal PICKB, and generate the third output clock signal ICKOB by performing an emphasis operation for the third clock signal ICKB based on the third gating clock signal PICKB. The fourth driver 324 may receive the fourth clock signal QCKB and the fourth gating clock signal PQCKB, and generate the fourth output clock signal QCKOB by performing an emphasis operation for the fourth clock signal QCKB based on the fourth gating clock signal PQCKB.

In FIG. 3, the first driver 321 may include a first buffer circuit 331 and a first emphasis circuit 341. The first buffer circuit 331 may buffer the first clock signal ICK and output the first output clock signal ICKO. The first buffer circuit 331 may be configured by an even number of inverters which are coupled in series. In FIG. 3, the first buffer circuit 331 may include first and second inverters IV1 and IV2. The first emphasis circuit 341 may receive the first gating clock signal PICK, and feed back the first output clock signal ICKO to the first clock signal ICK based on the first gating clock signal PICK. The first emphasis circuit 341 may invert the first output clock signal ICKO and feed back the inverted signal to the first clock signal ICK, such that an emphasis operation for the first clock signal ICK may be performed. The first emphasis circuit 341 may include a first control inverter CIV1 which is turned on based on the first gating clock signal PICK. When the first gating clock signal PICK is enabled, the first control inverter CIV1 may invert the first output clock signal ICKO and couple the inverted signal with the first clock signal ICK.

The second driver 322 may include a second buffer circuit 332 and a second emphasis circuit 342. The second buffer circuit 332 may buffer the second clock signal QCK and output the second output clock signal QCKO. The second buffer circuit 332 may include third and fourth inverters IV3 and IV4. The second emphasis circuit 342 may receive the second gating clock signal PQCK, and feed back the second output clock signal QCKO to the second clock signal QCK based on the second gating clock signal PQCK. The second emphasis circuit 342 may invert the second output clock signal QCKO and feed back the inverted signal to the second clock signal QCK, such that an emphasis operation for the second clock signal QCK may be performed. The second emphasis circuit 342 may include a second control inverter CIV2 which is turned on based on the second gating clock signal PQCK. When the second gating clock signal PQCK is enabled, the second control inverter CIV2 may invert the second output clock signal QCKO and couple the inverted signal with the second clock signal QCK.

The third driver 323 may include a third buffer circuit 333 and a third emphasis circuit 343. The third buffer circuit 333 may buffer the third clock signal ICKB and output the third output clock signal ICKOB. The third buffer circuit 333 may include fifth and sixth inverters IV5 and IV6. The third emphasis circuit 343 may receive the third gating clock signal PICKB, and feed back the third output clock signal ICKOB to the third clock signal ICKB based on the third gating clock signal PICKB. The third emphasis circuit 343 may invert the third output clock signal ICKOB and feed back the inverted signal to the third clock signal ICKB, such that an emphasis operation for the third clock signal ICKB may be performed. The third emphasis circuit 343 may include a third control inverter CIV3 which is turned on based on the third gating clock signal PICKB. When the third gating clock signal PICKB is enabled, the third control inverter CIV3 may invert the third output clock signal ICKOB and couple the inverted signal with the third clock signal ICKB.

The fourth driver 324 may include a fourth buffer circuit 334 and a fourth emphasis circuit 344. The fourth buffer circuit 334 may buffer the fourth clock signal QCKB and output the fourth output clock signal QCKOB. The fourth buffer circuit 334 may include seventh and eighth inverters IV7 and IV8. The fourth emphasis circuit 344 may receive the fourth gating clock signal PQCKB, and feed back the fourth output clock signal QCKOB to the fourth clock signal QCKB based on the fourth gating clock signal PQCKB. The fourth emphasis circuit 344 may invert the fourth output clock signal QCKOB and feed back the inverted signal to the fourth clock signal QCKB, such that an emphasis operation for the fourth clock signal QCKB may be performed. The fourth emphasis circuit 344 may include a fourth control inverter CIV4 which is turned on based on the fourth gating clock signal PQCKB. When the fourth gating clock signal PQCKB is enabled, the fourth control inverter CIV4 may invert the fourth output clock signal QCKOB and couple the inverted signal with the fourth clock signal QCKB.

Figure 4:
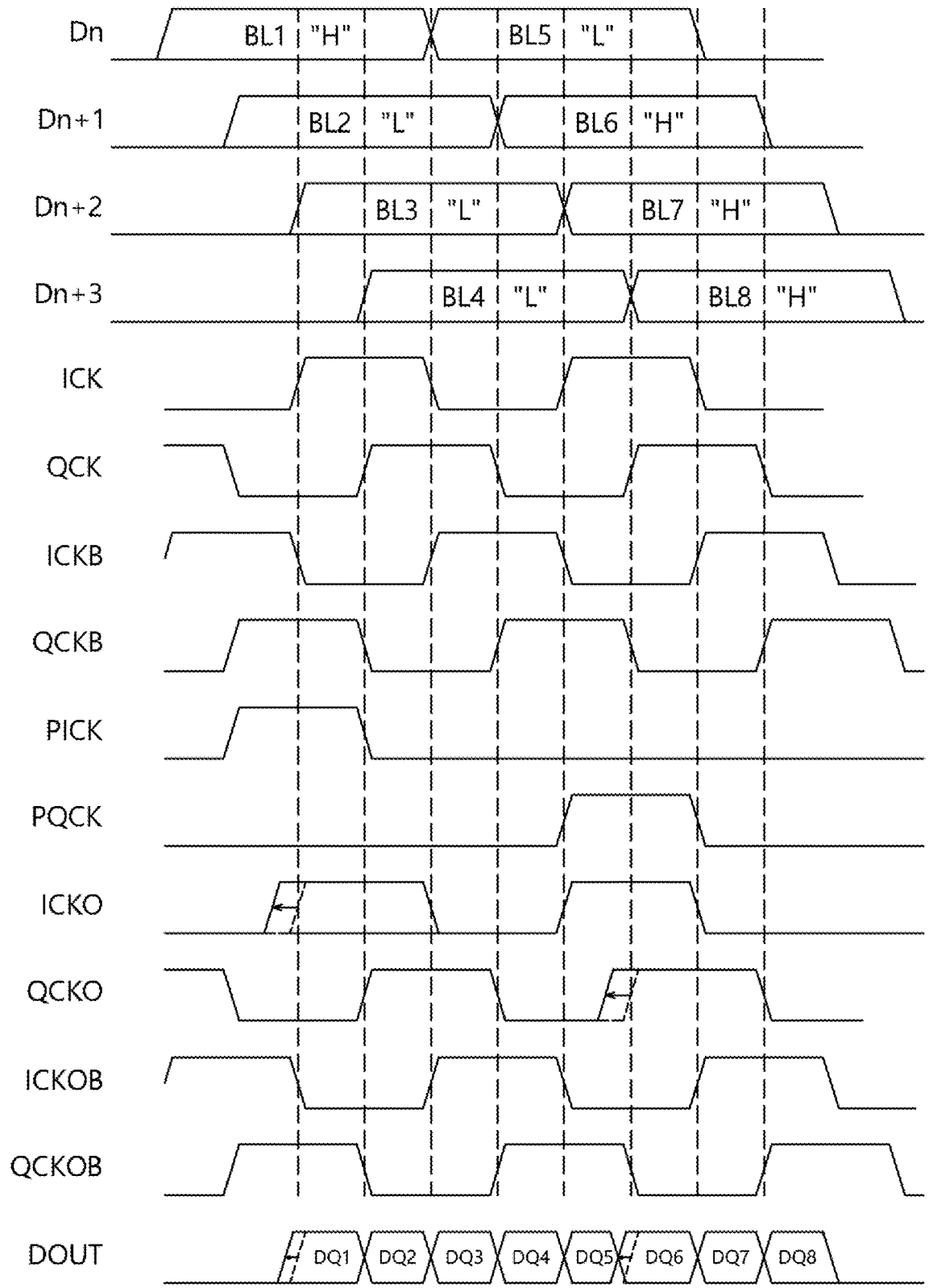
FIG. 4 is a timing diagram to assist in the explanation of the operation of the transmitting circuit in accordance with the embodiment.

FIG. 4 is a representation of an example of a diagram to assist in the explanation of the operation of the transmitting circuit 200 in accordance with an embodiment. The operations of the transmitting circuit 200 and the semiconductor system 1 in accordance with the embodiments will be described below with reference to FIGS. 1 to 4. It will be exemplified that the first semiconductor apparatus 110 transmits eight data to the second semiconductor apparatus 120. In FIG. 4, BL1 may be first data, BL2 may be second data, BL3 may be third data, BL4 may be fourth data, BL5 may be fifth data, BL6 may be sixth data, BL7 may be seventh data, and BL8 may be eighth data. BL1 and BL5 may be the nˆth data Dn, BL2 and BL6 may be the (n+1)ˆth data Dn+1, BL3 and BL7 may be the (n+2)ˆth data Dn+2, and BL4 and BL8 may be the (n+3)ˆth data Dn+3. BL1 is the first data, and may have a high level ("H"). For example, the rising edges of the first clock signal ICK may be center-aligned with BL1 and BL5, the rising edges of the second clock signal QCK may be center-aligned with BL2 and BL6, the rising edges of the third clock signal ICKB may be center-aligned with BL3 and BL7, and the rising edges of the fourth clock signal QCKB may be center-aligned with BL4 and BL8.

Since no data is outputted before BL1 is outputted and BL1 has the high level, the data detecting circuit 211 may enable the emphasis control signal EMP<1>. The gating signal generator 310 may generate the first gating clock signal PICK from the fourth clock signal QCKB based on the emphasis control signal EMP<1>. The first emphasis circuit 341 of the first driver 321 may invert the first output clock signal ICKO based on the first gating clock signal PICK, and couple the inverted signal with the first clock signal ICK. Since the first output clock signal ICKO is a low level when the first gating clock signal PICK is enabled, a signal of a high level may be provided to the first clock signal ICK and thus an emphasis operation for the first clock signal ICK may be performed. Accordingly, the rising edge of the first output clock signal ICKO may be generated earlier than the rising edge of the first clock signal ICK, and the first output clock signal ICKO may have a pulse width wider than the first clock signal ICK. In FIG. 4, the first output clock signal ICKO may be enabled at a point of time earlier than the point of time indicated by the dotted line. The serializer 220 may output BL1 as the output data DOUT in synchronization with the first output clock signal ICKO of which phase is advanced in comparison with the first clock signal ICK. Therefore, the eye and/or valid window of first output data DQ1 may be increased by a period by which the phase of the first output clock signal ICKO is advanced, and the first output data DQ1 having a high level may be precisely outputted. If BL1 is a low level and BL2 is a high level, since high level data to be outputted first is BL2, the data detecting circuit 211 may enable the emphasis control signal EMP<2>, an emphasis operation for the second clock signal QCK may be performed, and the eye and/or valid window of second output data DQ2 may be increased.

However, since BL1 is a high level ("H") and the next successively outputted data BL2 is a low level ("L") the data detecting circuit 211 may sense that data of a low level is outputted after data of a high level is outputted less than a threshold number of times, and thus might not enable the emphasis control signal EMP<2> associated with BL2. Additionally, since all of BL2, BL3, BL4 and BL5 have low levels ("L"), the data detecting circuit 211 might not enable the emphasis control signals EMP<1:4>, and an emphasis operation for the first to fourth clock signals ICK, QCK, ICKB and QCKB might not be performed. Therefore, BL2 may be outputted as second output data DQ2 in synchronization with the second output clock signal QCKO which has the same phase as the second clock signal QCK, and BL3 may be outputted as third output data DQ3 in synchronization with the third output clock signal ICKOB which has the same phase as the third clock signal ICKB. BL4 may be outputted as fourth output data DQ4 in synchronization with the fourth output clock signal QCKOB which has the same phase as the fourth clock signal QCKB, and BL5 may be outputted as fifth output data DQ5 in synchronization with the first output clock signal ICKO which has the same phase as the first clock signal ICK.

BL6 may have a high level "H," and the data detecting circuit 211 may sense that data having low levels have been successively outputted before BL6 is outputted. Since BL2 to BL5 are the low levels ("L") and BL6 is the high level ("H"), the data detecting circuit 211 may sense that data of a high level is outputted after data of a low level is outputted at least a threshold number of times, and may enable the emphasis control signal EMP<2> associated with BL6. The gating signal generator 310 may generate the second gating clock signal PQCK from the first clock signal ICK based on the emphasis control signal EMP<2>. The second emphasis circuit 342 of the second driver 322 may invert the second output clock signal QCKO based on the second gating clock signal PQCK, and couple the inverted signal with the second clock signal QCK. Since the second output clock signal QCKO is a low level when the second gating clock signal PQCK is enabled, a signal of a high level may be provided to the second clock signal QCK and thus an emphasis operation for the second clock signal QCK may be performed. Accordingly, the rising edge of the second output clock signal QCKO may be generated earlier than the rising edge of the second clock signal QCK, and the second output clock signal QCKO may have a pulse width wider than the second clock signal QCK. In FIG. 4, the second output clock signal QCKO may be enabled at a point of time earlier than the point of time indicated by the dotted line. The serializer 220 may output BL6 as the output data DOUT in synchronization with the second output clock signal QCKO of which phase is advanced in comparison with the second clock signal QCK. Therefore, the eye and/or valid window of sixth output data DQ6 may be increased by a period by which the phase of the second output clock signal QCKO is advanced, and the sixth output data DQ6 having the high level may be precisely outputted.

However, since BL6 is a high level ("H") and the next successively outputted data BL7 is also a high level ("H") the data detecting circuit 211 may sense that data of a high level is outputted after data of a high level is outputted, and thus might not enable the emphasis control signal EMP<3> associated with BL7. Additionally, since both of BL7 and BL8 have high levels ("H"), the data detecting circuit 211 might not enable the emphasis control signals EMP<3:4>, and an emphasis operation for the third and fourth clock signals ICKB and QCKB might not be performed. Therefore, BL7 may be outputted as seventh output data DQ7 in synchronization with the third output clock signal ICKOB which has the same phase as the third clock signal ICKB, and BL8 may be outputted as eighth output data DQ8 in synchronization with the fourth output clock signal QCKOB which has the same phase as the fourth clock signal QCKB.

Figure 5:
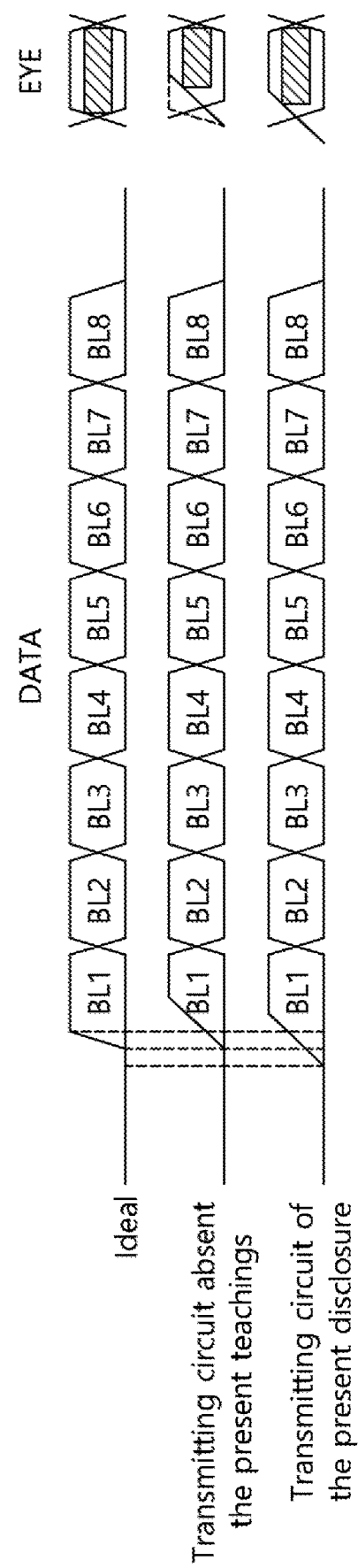
FIG. 5 is a diagram illustrating output data outputted from a transmitting circuit in an ideal case, absent using a transmitting circuit of the present disclosure, and using a transmitting circuit of the present disclosure.

FIG. 5 is a diagram illustrating a representation of an example of output data outputted from a transmitting circuit in an ideal case, not using a transmitting circuit of the present disclosure and using a transmitting circuit of the present disclosure. In an ideal case, first to eighth output data DQ1 to DQ8 may be generated to have the same wide eye. In FIG. 5, each of the hatched portions may correspond to a data eye. When the first output data DQ1 is a high level, as in the case whereby a transmitting circuit of the present disclosure is not used, a phenomenon may occur, in which the eye of the first output data DQ1 decreases. The level of output data is held at a low level or a high resistance state before the first output data DQ1 is outputted. In the case where output data of the high level is outputted while being held in the low level or the high resistance state, inter-symbol interference may severely occur. Thus, the eye or valid window of the first output data DQ1 may be decreased. The transmitting circuit 200 in accordance with the embodiments may perform an emphasis operation for the first clock signal ICK which is used in outputting the first output data DQ1, and may generate the first output clock signal ICKO which has a phase earlier than the first clock signal ICK, as shown in FIG. 4. Since the first output data DQ1 is outputted based on the first output clock signal ICKO which has a phase earlier than the first clock signal ICK, the first output data DQ1 may have a data eye wider than a transmitting circuit which does not use the present teachings even in a situation where inter-symbol interference occurs, and thus, output data having an eye of substantially the same size as in the ideal case may be generated.

While various embodiments have been described above, it will be understood to those skilled in the art that the embodiments described are examples only. Accordingly, the transmitting circuit improving data eye, the semiconductor apparatus and the semiconductor system using the same described herein should not be limited based on the described embodiments.

What is claimed is:

1. A transmitting circuit comprising:
   a clock generation circuit configured to receive a plurality of clock signals to generate a plurality of output clock signals and to advance a phase of rising edge of a specific clock signal among the plurality of output clock signals by sensing the logic levels of a plurality of data signals; and
   a serializer configured to receive the plurality of data signals and output the plurality of data signals as output data which is serial type data in synchronization with the plurality of output clock signals.

2. The transmitting circuit according to claim 1, wherein the clock generation circuit generates the plurality of output clock signals by extending pulse widths of the plurality of clock signals.

3. The transmitting circuit according to claim 1, wherein the clock generation circuit generates the plurality of output clock signals by advancing phases of edges of the plurality of clock signals.

4. The transmitting circuit according to claim 1, wherein, when a data signal having a high level is outputted first among the plurality of data signals, the clock generation circuit generates an output clock signal by performing an emphasis operation for a clock signal with which the data signal having a high level is synchronized.

5. The transmitting circuit according to claim 1, wherein, when a data signal having a low level is outputted first among the plurality of data signals, the clock generation circuit generates an output clock signal by performing an emphasis operation for a clock signal with which the data signal having a low level is synchronized.

6. The transmitting circuit according to claim 1, wherein, when a data signal having other level is outputted as the output data after data signals having one of a low level or a high level are successively outputted as the output data by a threshold number of times, the clock generation circuit generates an output clock signal by performing an emphasis operation for a clock signal with which the data signal having the other level is synchronized.

7. The transmitting circuit according to claim 1, wherein the clock generation circuit comprises:
   a data detecting circuit configured to generate emphasis control signals by detecting logic levels of the plurality of data signals; and
   a clock emphasis circuit configured to generate the plurality of output clock signals by performing an emphasis operation for the plurality of clock signals based on the plurality of clock signals and the emphasis control signals.

8. The transmitting circuit according to claim 7, wherein the clock emphasis circuit comprises:
   a gating signal generator configured to generate a plurality of gating clock signals from the plurality of clock signals based on the emphasis control signals; and
   a clock driver configured to generate the plurality of output clock signals from the plurality of clock signals based on the plurality of gating clock signals.

9. The transmitting circuit according to claim 8, wherein the gating signal generator outputs, when a specific emphasis control signal is enabled, a clock signal which has a phase earlier than a clock signal associated with the specific emphasis control signal, as a gating clock signal.

10. The transmitting circuit according to claim 8, wherein the clock driver generates the plurality of output clock signals by advancing phases of the plurality of clock signals based on the plurality of gating clock signals.

11. A transmitting circuit comprising:
    a serializer configured to output n^th data signal in synchronization with a first output clock signal, output (n+1)^th data signal in synchronization with a second output clock signal, output (n+2)^th data signal in synchronization with a third output clock signal, and output (n+3)^th data signal in synchronization with a fourth output clock signal; and
    a clock generation circuit configured to advance a phase of a rising edge of at least one of a first clock signal, a second clock signal, a third clock signal and a fourth clock signal by sensing logic levels of the n^th data signal, the (n+1)^th data signal, the (n+2)^th data signal and the (n+3)^th data signal to generate the first output clock signal, the second output clock signal, the third output clock signal, and the fourth output clock signal from the first clock signal, the second clock signal, the third clock signal, and the fourth clock signal,
    wherein n is an integer.

12. The transmitting circuit according to claim 11, wherein the clock generation circuit generates the first to fourth output clock signals by performing an emphasis operation for at least one among the first to fourth clock signals based on at least one among the n^th data signal, the (n+1)^th data signal, the (n+2)^th data signal, and the (n+3)^th data signal.

13. The transmitting circuit according to claim 12, wherein an output clock signal which is generated as the emphasis operation is performed has a phase earlier or a pulse width wider than a corresponding clock signal.

14. The transmitting circuit according to claim 11, wherein, when a data signal having a high level is outputted first among the n^th to (n+3)^th data signals, the clock generation circuit generates the first to fourth output clock signals by performing an emphasis operation for a clock signal with which the data signal having a high level is synchronized.

15. The transmitting circuit according to claim 11, wherein, when a data signal having a low level is outputted first among the n^th to (n+3)^th data signals, the clock generation circuit generates the first to fourth output clock signals by performing an emphasis operation for a clock signal with which the data signal having a low level is synchronized.

16. The transmitting circuit according to claim 11, wherein, when a data signal having the other level is outputted as output data after data signals having one level of a low level or a high level are successively outputted as output data by a threshold number of times, the clock generation circuit generates the first to fourth output clock signals by performing an emphasis operation for a clock signal with which the data signal having other level is synchronized.

17. The transmitting circuit according to claim 11, wherein the clock generation circuit comprises:
 a data detecting circuit configured to generate emphasis control signals by detecting logic levels of the n^th to (n+3)^th data signals; and
 a clock emphasis circuit configured to generate the first to fourth output clock signals by performing an emphasis operation for the first to fourth clock signals based on the emphasis control signals.

18. The transmitting circuit according to claim 17, wherein the clock emphasis circuit comprises:
 a gating signal generator configured to generate first to fourth gating clock signals from the first to fourth clock signals based on the emphasis control signals; and
 a clock driver configured to generate the first to fourth output clock signals from the first to fourth clock signals based on the first to fourth gating clock signals.

19. The transmitting circuit according to claim 18, wherein, based on the emphasis control signals, the gating signal generator generates the first gating clock signal by using the fourth clock signal, generates the second gating clock signal by using the first clock signal, generates the third gating clock signal by using the second clock signal, and generates the fourth gating clock signal by using the third clock signal.

20. The transmitting circuit according to claim 19, wherein the clock driver comprises:
 a first driver configured to generate the first output clock signal by buffering the first clock signal, and feed back the first output clock signal to the first clock signal based on the first gating clock signal;
 a second driver configured to generate the second output clock signal by buffering the second clock signal, and feed back the second output clock signal to the second clock signal based on the second gating clock signal;
 a third driver configured to generate the third output clock signal by buffering the third clock signal, and feed back the third output clock signal to the third clock signal based on the third gating clock signal; and
 a fourth driver configured to generate the fourth output clock signal by buffering the fourth clock signal, and feed back the fourth output clock signal to the fourth clock signal based on the fourth gating clock signal.

* * * * *